United States Patent
Yamada et al.

(10) Patent No.: US 8,800,442 B2
(45) Date of Patent: Aug. 12, 2014

(54) SCREEN PRINTING APPARATUS

(75) Inventors: Kazuaki Yamada, Shizuoka (JP);
Yasushi Miyake, Shizuoka (JP)

(73) Assignee: Yamaha Hatsudoki Kabushiki Kaisha, Shizuoka-ken (JP)

( * ) Notice: Subject to any disclaimer, the term of this patent is extended or adjusted under 35 U.S.C. 154(b) by 69 days.

(21) Appl. No.: 13/483,978

(22) Filed: May 30, 2012

(65) Prior Publication Data

US 2012/0304877 A1  Dec. 6, 2012

(30) Foreign Application Priority Data

May 31, 2011 (JP) ................. 2011-122924

(51) Int. Cl.
*B41F 15/08* (2006.01)
*B41F 15/16* (2006.01)
*B41F 15/26* (2006.01)

(52) U.S. Cl.
USPC ............ 101/126; 101/123; 101/124; 101/129

(58) Field of Classification Search
USPC ................... 101/114, 123, 126, 129
See application file for complete search history.

(56) References Cited

U.S. PATENT DOCUMENTS

| | | | |
|---|---|---|---|
| 5,730,051 A | 3/1998 | Takahashi et al. | |
| 6,202,551 B1 * | 3/2001 | Murakami | 101/123 |
| 6,267,819 B1 * | 7/2001 | Doyle et al. | 118/213 |
| 8,196,287 B2 * | 6/2012 | Awata et al. | 29/740 |
| 8,327,761 B2 * | 12/2012 | Miyahara et al. | 101/126 |
| 2010/0126363 A1 | 5/2010 | Mizuno et al. | |
| 2010/0242755 A1 * | 9/2010 | Nagao | 101/126 |
| 2011/0239883 A1 | 10/2011 | Vegelahn et al. | |

FOREIGN PATENT DOCUMENTS

| | | |
|---|---|---|
| DE | 10 2008 051 052 A1 | 4/2010 |
| JP | 07-205399 A | 8/1995 |
| WO | 2009/035136 A1 | 3/2009 |

OTHER PUBLICATIONS

The extended European Search Report dated Oct. 8, 2012; EP Application No. 12004143.9-2304.

* cited by examiner

*Primary Examiner* — Ren Yan
*Assistant Examiner* — Marissa Ferguson Samreth
(74) *Attorney, Agent, or Firm* — Studebaker & Brackett PC

(57) ABSTRACT

A screen printing apparatus in which two printing units are provided in a production line which transports boards from a single board exit position set on a downstream side in a conveyance direction. One printing unit being disposed is available for set-up tasks while the other printing unit is working. Since set-up tasks can be conducted in one printing unit while the other printing unit is working, then it is possible to improve through-put dramatically even in cases where small-volume diverse-component production is carried out in a single lane.

5 Claims, 10 Drawing Sheets

SCREEN PRINTING APPARATUS

BACKGROUND OF THE INVENTION

1. Field of the Invention

The present invention relates to a screen printing apparatus, and more particularly, to a screen printing apparatus which performs screen printing of cream solder, conductive paste or the like onto a board such as a printed wiring board (PWB), as pre-processing for mounting electronic components on the board.

2. Description of the Background Art

A screen printing apparatus is incorporated into a production line for printed circuit boards (PCBs) to carryout screen printing of conductive paste, or the like, onto a board conveyed from an upstream side. The apparatus then sends the board out to a component mounting apparatus on a downstream side. As disclosed in Japanese Patent Application Laid-Open No. H7-205399, one kind of screen printing apparatus which is used in single lane (single lane refers to a production line in which entry and exit paths for the printing apparatus are respectively formed in one single track) has one printing unit which receives boards one by one to conduct a printing process to each board. The apparatus then transports the printed boards towards a component mounting apparatus.

In the prior art, the production line is often required to be halted at every time of replacing tasks because the single lane needs to conduct replacing tasks (replacing the screen mask, and/or the parameter data) and printing task in a sequential manner. Therefore, through-put could be remarkably worse; particularly it will be worse when the production line conducts so-called small-volume diverse-component production.

SUMMARY OF THE INVENTION

In view of these circumstances, an object of the present invention is to improve through-put in a screen printing apparatus which takes, from a prescribed board entry position, a board conveyed along a prescribed conveyance direction, carries out screen printing, and transports the board after printing from a single board exit position set on a downstream side in terms of the conveyance direction.

A desirable mode of the present invention is a screen printing apparatus which is provided with first and second printing units which are capable of executing a printing process for the screen printing including steps of receiving the board from the board entry position to be provided for the screen printing, carrying out the screen printing, and conveying the board after screen printing so as to transport the board from the board exit position; and a control unit for controlling operation of the first and second printing units in such a manner that one of the first and second printing units functions as a working system that carries out the printing process, while the other printing unit is provided as a standby system that is available for a set-up task for a next process. In this mode, a pair of printing units are equipped with a single-lane production line, and set-up tasks for a next process can be performed in parallel in one printing unit while the other printing unit is operated to carry out a printing process, whereby the through-put of both printing units is raised and printing efficiency is improved.

These and other objects, features and advantages of the present invention will become more apparent upon reading the following detailed description along with the accompanying drawings.

DESCRIPTION OF THE PREFERRED EMBODIMENTS

A preferred mode of implementing the present invention is described below in detail with reference to the accompanying drawings.

The screen printing apparatus 1 is disposed between a single loader L which is arranged to correspond to an upstream-side apparatus, and an entry unit LM of a component mounting apparatus M which is disposed on a downstream side. A belt conveyor pair CL is provided on the loader L, while a belt conveyor pair CM is provided on the entry unit LM of the component mounting apparatus M. A board W is conveyed along these belt conveyor pairs CL, CM. In the board conveyance direction, a board entry position En opposing to the loader L is set on the upstream side of the screen printing apparatus 1, and a board exit position Ex opposing to the entry unit LM is set on the downstream side of the screen printing apparatus 1. The board entry position En and the board exit position Ex are mutually opposing in a center line of the apparatus which follows along an X axis direction.

The screen printing apparatus 1 is provided with two printing units provided on a base 2. Each printing unit is a unit having a board supporting table 10A (10B) for supporting a board W and a printing execution unit 20A (20B) which carries out screen printing on a board W supported by the board supporting table 10A (10B). These members 10A (10B) and 20A (20B) are detachably integrated by a frame 6 and are movable in a Y axis direction, respectively. The first printing execution unit 20A is provided above the first board supporting table 10A, and the second printing execution unit 20B is provided above the second board supporting table 10B.

The board supporting tables 10A, 10B are respectively composed in such a manner that a board W which is transported from the loader L on the upstream side is taken in from a board entry position En, screen printing is performed at a printing position SP (see FIG. 2 and FIG. 3) which is set between the board entry position En and the board exit position Ex, and the printed board W is sent out from the printing position SP to the board exit position Ex, to transport the board W to the belt conveyor pair CM of the component mounting apparatus M.

Figure 3:
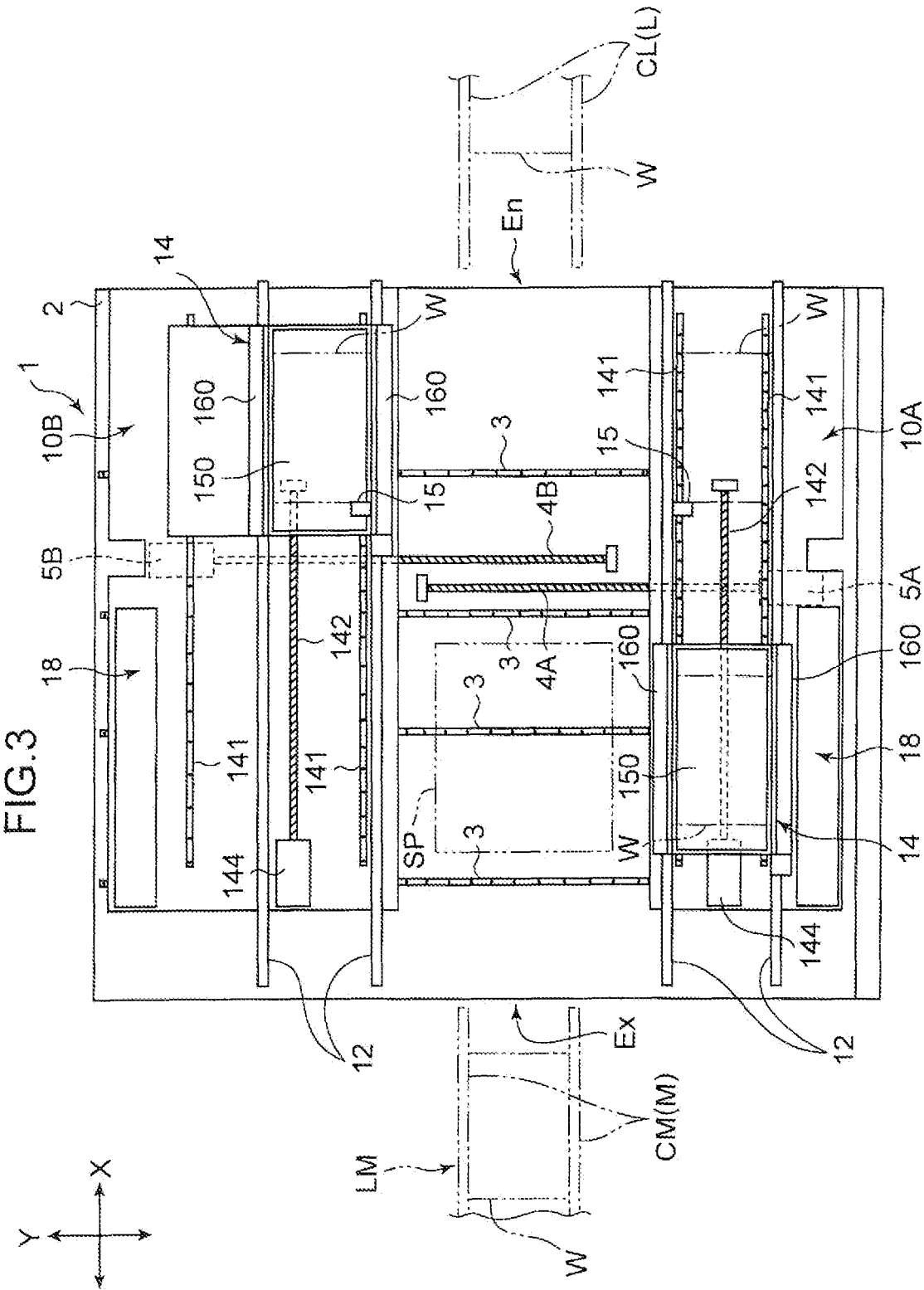
FIG. 3 is a schematic plan view showing the principal parts of the screen printing apparatus in FIG. 1.

As shown in FIG. 3, the board supporting tables 10A, 10B have a substantially rectangular shape which is long in the X axis direction, in plan view, and are composed to move independently in the Y axis direction by means of a table driving mechanism. The table driving mechanism is constituted by a screw feed mechanism. In other words, the board supporting tables 10A, 10B are supported movably on common fixed rails 3 which are provided over the base 2 and which extend in the Y axis direction, and are respectively moved reciprocally in the Y axis direction by drive force from motors 5A, 5B via screw shafts 4A, 4B. Each of the first and second board supporting tables 10A and 10B is composed, on the basis of control of the motors by a control unit 60 which is described hereinafter, to be moved on the X axis between a working position which is located between the conveyor pair CL of the loader L and the belt conveyor pair CM of the component mounting apparatus M, and respective standby positions to which the board supporting table 10A (10B) is withdrawn from the working position, in a direction away from the counterpart board supporting table 10B (10A).

Referring to FIG. 3, the board supporting tables 10A, 10B are provided with a conveyor pair 12 for receiving and delivering a board W, a clamp unit 14 for supporting and fixing a board W on the conveyor pair 12, so as to allow printing on the board W, a clamp unit drive mechanism for moving the clamp unit 14 in the X axis direction along the conveyor pair 12, and a cleaning unit 18 for cleaning a screen mask 21, which is described below, and the like.

The belt conveyor pair 12 is in the form of belt conveyors. The belt conveyors receive a board W transported from the loader L, at a board entry position En, and convey the board W from the board entry position En to a prescribed position set on the board supporting table 10A, 10B, and also convey a board W after a printing process, to a board exit position Ex, and send the board W out to the belt conveyor pair CL of the component mounting apparatus M, from the board exit position Ex.

In the present embodiment, in the first board supporting table 10A which is disposed on a front side of the apparatus (the lower side in FIG. 1 and FIG. 3; also called "side A" below), the rear side of the conveyor pair 12 is set as a fixed conveyor and the front side thereof is set as a movable conveyor, whereby the gap between the conveyors can be changed with reference to the conveyor on the rear side of the apparatus (the upper side in FIG. 1 and FIG. 3; also called "side B" below). In the second board supporting table 10B which is disposed on "side B" on the contrary, the front side of the conveyor pair 12 is set as a fixed conveyor and the rear side thereof is set as a movable conveyor, whereby the gap between the conveyors can be changed with reference to the conveyor on the front side.

The clamp unit 14 is supported movably in the X axis direction along fixed rails 141 provided on base plates 101A, 101B of the board supporting tables 10A, 10B. The clamp unit 14 is provided with a back-up mechanism for supporting and lifting a board W from the conveyor pair 12, and a clamp mechanism for fixing a board W lifted by the back-up mechanism.

Figure 2:
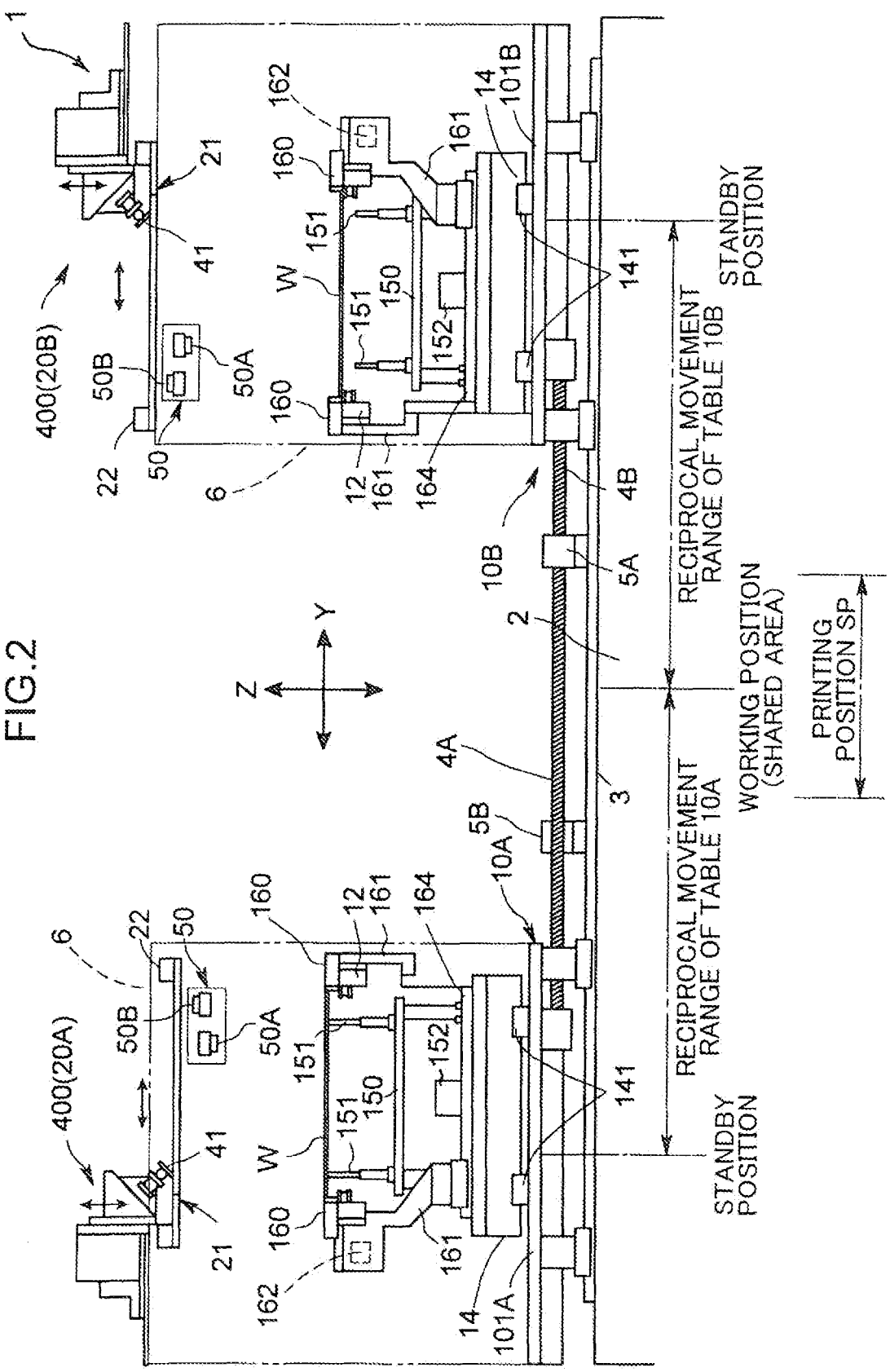
FIG. 2 is a schematic side view drawing of the screen printing apparatus in FIG. 1.

Referring to FIG. 2, the back-up mechanism is provided with a plurality of back-up pins 151 in a prescribed arrangement, a back-up table 150 which is supported on an X table (not illustrated) via a ball screw mechanism or the like so as to be movable upwardly or downwardly, and a drive motor 152, such as a ball screw mechanism or the like. The mechanism such as ball screw is driven by the motor 152, thereby displacing the back-up table 150 between a prescribed release position and an operating position raised above the release position. Here, the release position is a position where the front end position of the back-up pin 151 is lower than the lower surface of the substrate W supported by the belt conveyor pair 12 (the position shown by the board supporting table 10B on the right side in FIG. 2). The operating position is a position where the front end position of the back-up pin 151 is higher than the lower surface of the board W (the position shown by the board supporting table 10A on the left side in FIG. 2). Therefore, as shown on the left side in FIG. 2, this back-up mechanism picks up the board W from the belt conveyor pair 12 when the back-up table 150 is disposed in the operating position.

The clamp mechanism includes a pair of clamp members 160 which are arranged on a pair of arm members 161 so as to extend mutually in parallel in the X axis direction, and an actuator such as a two-way air cylinder 162 for driving the clamp members. One of the two clamp members 160 is assembled so as to be displaceable in the Y axis direction with respect to the arm member 161, and is displaced between a release position and a clamp position along the Y axis direction by the air cylinder 162. In such a way, the clamp mechanism performs a function of clamping the board W lifted by the back-up mechanism when the one clamp member 160 moves from the release position to the clamp position so as to clamp the board W with the other, and a function of releasing it when the one clamp member 160 is displaced from the clamp position to the release position.

In a printing process, a screen mask 21 described below will be placed atop the board W which is lifted up from the belt conveyor pair 12 by the clamp unit 14 and is clamped by the clamp member 160. The clamp unit 14 thus lifts up the board W from the belt conveyor pair 12 and holds it to be allowed screen printing by the printing execution unit 20.

Each arm member 161 is formed as if it embraces the belt conveyor pair 12 from the outer side (the outer side in the Y axis direction). One arm member 161 is fixed to one end portion on the X table (not illustrated). The other arm member 161 is provided slidably on a fixed rail 164 which is fixed on the X table along Y axis direction. By adjusting a sliding amount of the other arm member 161, the conveyor width of the belt conveyor pair 12 is adjusted to be compatible with boards W of various widths in the Y direction. Furthermore, the relative distance between the belt conveyor pair 12 and the clamp members 160 remains in constant regardless the adjusted conveyor width, so that it is possible to clamp the board W accurately regardless the width in the Y axis direction.

Referring to FIG. 3, the clamp unit drive mechanism is composed by a screw feed mechanism. That is, the clamp unit 14 is supported movably on a fixed rail 141 which extends in the X axis direction and which is provided on the base plates 101A, 101B of the board supportable tables 10A, 10B, and the clamp unit 14 is driven by a motor 144 via a screw shaft 142. In the board supporting tables 10A, 10B, a board standby position is set to a position in the vicinity of the board entry position En, and a printing execution position is set to a prescribed position to the downstream side of the board standby position. The clamp unit 14 moves between the board standby position (the position shown on the right side in FIG. 2) and the printing execution position (the position shown on the left side in FIG. 2), on the basis of motor control performed by the control unit 60 which is described below.

The second board supporting table 10B is essentially common with the first board supporting table 10A except the board W is clamped with reference to the front side of the apparatus.

Although not depicted in detail, the cleaning unit 18 is provided with a pad which can slide on the lower surface of the screen mask 21 described below, and a cleaning head including a suction nozzle which suctions the screen mask 21 with a negative pressure via this pad, and the like. The cleaning unit 18 removes and collects the paste on the lower surface of the screen mask 21 and inside the pattern holes of the mask by slide contacting the cleaning head with the lower surface of the mask when the board supporting tables 10A, 10B are moved in the Y axis direction. The cleaning head is movable upwardly and downwardly with respect to the substrate supporting tables 10A, 10B. The cleaning head is arranged at a working position when the head can slide contacting with the screen mask 21 only during cleaning. The cleaning head is arranged at a withdrawn position lowered from the working position at other times.

Figure 1:
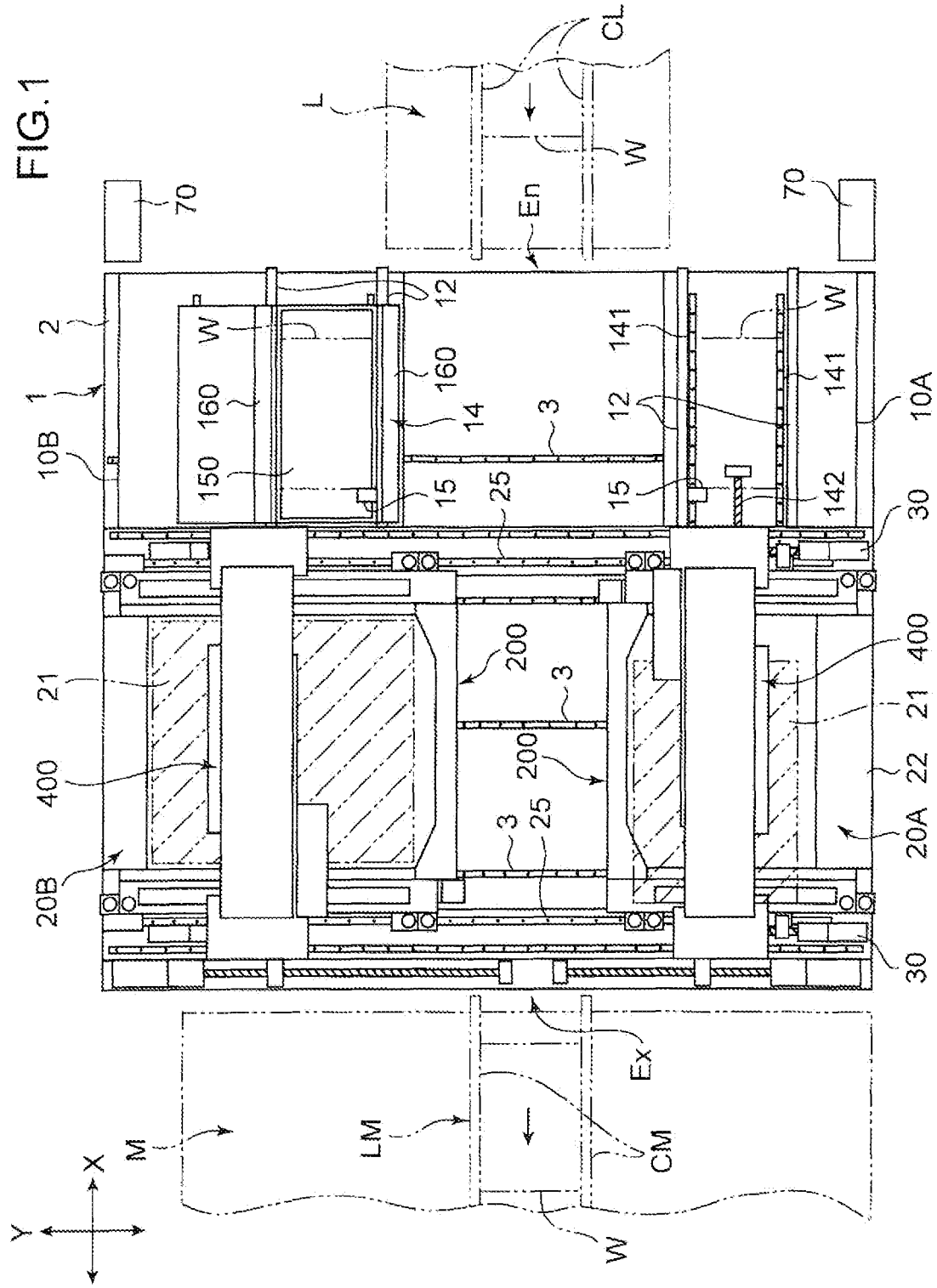
FIG. 1 is a schematic plan view of a screen printing apparatus relating to one embodiment of the present invention.

The reference numeral 15 in FIGS. 1 to 3 is a stopper mechanism of the conveyor pair 12. The stopper mechanism 15 halts the board W to be stand-by at the board standby position described above, when the board W is received on the conveyor pair 12. This stopper mechanism 15 has a stopper shaft which is driven to advance and retract by an actuator, such as an air cylinder, or the like. The stopper shaft is adapted to switch between operational and idle states. In the operational state, the stopper shaft is caused to stretch into the conveyance path of the board W by the conveyor pair 12 so as to restrict the movement of the board W. In the idle state, the stopper shaft is caused to retract from the conveyance path so as to permit movement of the board W.

The printing execution unit 20 is provided with a screen mask unit 200, and a squeegee unit 400 in which the screen mask unit 200 is arranged in the X axis direction.

The screen mask unit 200 includes a screen mask 21 and a mask fixing member 22 to which the screen mask 21 is fixed. The screen mask 21 is adapted to raise and lower via the mask fixing member 22 between attaching and release positions. In the attaching position, the screen mask 21 is placed atop the board W which is beneath of the screen mask 21, and is lifted up to the working position by the board supporting table 10A (10B). In the release position, the screen mask 21 raises above the attaching position. The mask fixing member 22 of the screen mask unit 200 is held detachably by a clamp mechanism (not illustrated). By operating the clamp mechanism described above, a user is able to change the screen mask 21 in accordance with the part types of the board W which is the object of manufacture, by changing the mask fixing member 22 at the release position.

The mask fixing member 22 is in the form of a rectangular frame having an opening section for screen printing formed in the center thereof, and a previously assembled screen mask 21 is fixed detachably to the mask fixing member 22 so as to close off the opening section.

The screen mask 21 is provided with a printing area in which openings corresponding to a circuit pattern to be printed onto the board W are formed.

The squeegee unit 400 is a unit which spreads a coating material, such as cream solder, conductive paste, or the like, onto the screen mask 21 by a squeegee 41, while performing a rolling (kneading) action. In the example shown in the drawings, the squeegee unit 400 is coupled to the screen mask unit 200 via an adjustment mechanism (rail 25, motor 30, and the like) which can adjust the phase about the Z axis with respect to the screen mask 21.

As shown in FIG. 2, an imaging unit 50 is attached to the printing execution unit 20. The imaging unit 50 serves to perform image recognition of the positional relationship between the screen mask 21 and the board W, and comprises two mask recognition cameras 50A which capture images, from a lower side, of a plurality of indicators, such as marks or symbols, which are provided on a lower surface of the screen mask 21, and two board recognition cameras 50B which capture images, from an upper side, of a plurality of indicators, such as marks or symbols, on a board W which is supported by the board supporting tables 10A, 10B.

Figure 4:
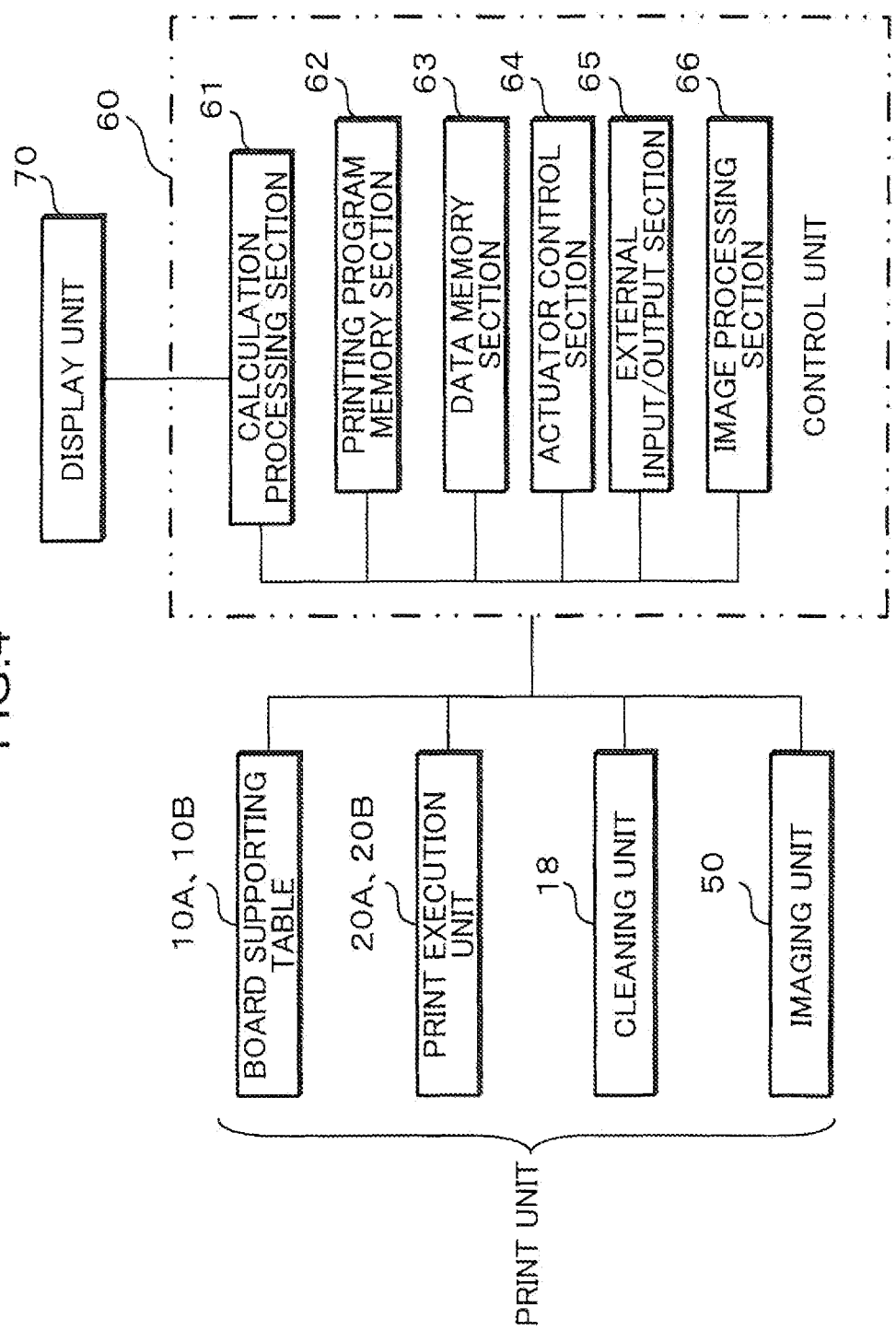
FIG. 4 is a block diagram of the screen printing apparatus in FIG. 1.

Referring to FIG. 4, the control unit 60 for controlling the screen printing apparatus 1 includes a calculation processing section 61 such as a microprocessor, or the like, a print program memory section 62 which stores transaction data, and the like, for a printing process, a data memory section 63 which stores master data, and the like, which is required for control, an actuator control section 64 which drives actuators of the motors 5A, 5B, etc., an external input/output section 65 which is constituted by various interfaces, and the like, and an image processing section 66 which is constituted by a capture board, and the like. All actuators and the cameras, such as a mask recognition camera 50A, are electrically connected to the control unit 60 to be controllable. Consequently, the series of print processing operations by the board supporting tables 10A, 10B and the printing execution unit 20 are controlled systematically by the control unit 60. Furthermore, a display unit 70 which is capable of displaying a state of processing on a GUI, or the like, and an input apparatus (not illustrated) which is constituted by a pointing device, or the like, are connected to the control unit 60, in such a manner that transaction data can be input, and a program for achieving control processing can be set and/or modified, and the like, by actions performed by the operator. The printing program memory section 62 and the data memory section 63 are both logical concepts which are achieved by a combination of a ROM, RAM, auxiliary storage device, and the like.

The display unit 70 is disposed for each printing unit in the Y axis direction, and displays the operational status of the corresponding printing unit. As described below, the printing units relating to the present embodiment move alternately to a working position and execute a printing process. The display unit 70 of the printing unit which is withdrawn to a standby position reads out information required for a board set-up task to be executed in the next process, from the printing program memory section 62 or the data memory section 63. The display unit 70 then displays this information thereon.

Operating buttons are displayed on the display unit 70 via a GUI, and the user is able to instruct the control unit 60 to terminate or interrupt a set-up task, or the like, by operating the operating buttons by means of an input device, which is not illustrated.

Next, the operations according to the present embodiment will be described with reference to FIG. 5. In order to achieve the control described below, an end flag of Boolean type is set in the data memory section 63 of the control unit 60. The end flag is a flag which indicates that all processing has terminated.

After completion of a prescribed initial operation process, the control unit 60 resets the count variable R for counting the manufacturing sequence of the manufactured boards (step S1). Then, production data, such as a part number I(R) of the board W which corresponds to the count variable R, and a production quantity Tn(R) which is associated with this part number I(R), and so on, are obtained from the printing program storage unit 62 (step S2). Next, the control unit 60 respectively sets values RS and WS (step S3). RS is an identifier which identifies the printing unit that is working, and WS is an identifier which identifies a printing unit that is at standby. In the example illustrated here, the side A printing unit works initially while the side B printing unit is initially at standby.

Figure 6:
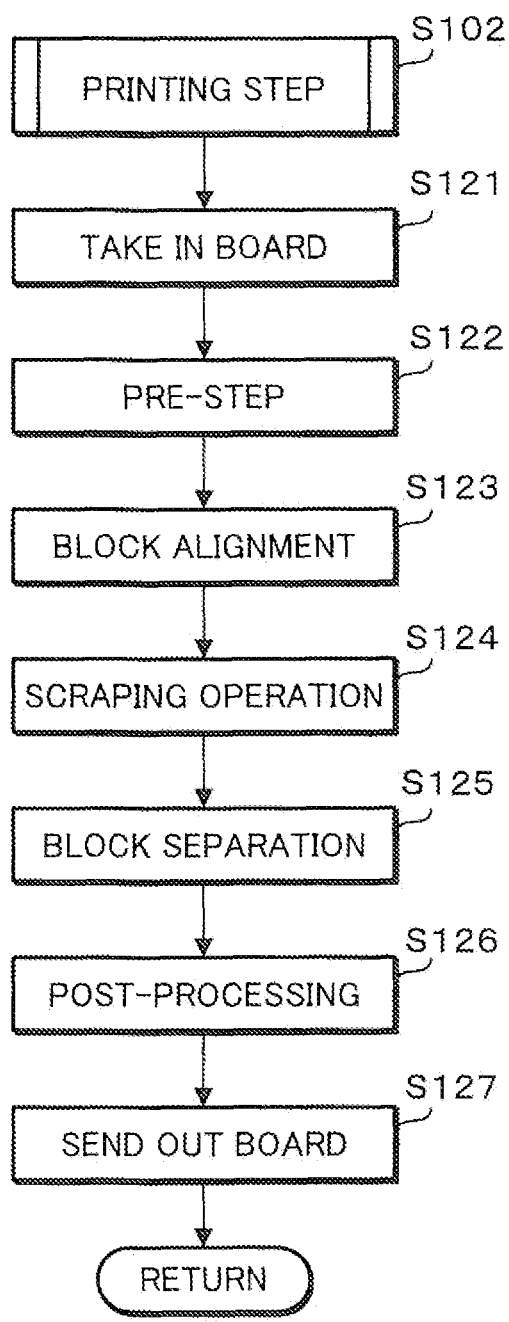
FIG. 6 is a flowchart showing a sub-routine of the printing process in the flowchart in FIG. 5.

Thereupon, the working side and the standby side execute parallel processing (step S10). In an initial operation in this parallel processing, the motor 5A is driven to move the side A printing unit to the working position, and the motor 5B is driven to move the side B printing unit to the withdrawn position on the basis of the setting in step S3. In this state, in the printing unit on the working side, the count variable N for counting the production quantity is reset to 0 (step S101). The sub-routine of the printing process is then executed (step S102). In this sub-routine S102 of the printing process, as shown in FIG. 6, the following steps are carried out: receiving a board (step S121), pre-processing (step S122), block alignment (step S123), scraping operation for scraping away cream solder (step S124), block separation (step S125), post-processing (step S126), transport operation for transporting the printed board W (step S127). Of these steps, the pre-processing (step S122) includes, for example, steps of: "mark recognition" for recognizing indicators on the board W, "bad mark recognition" for recognizing defect marks which are set on any board W from a multi-piece substrate which is divided up after component mounting, and "foreign material inspection" for inspecting for foreign material which has become attached to the board W. Furthermore, the post-processing (step S126) includes, for example: a "cleaning" step of cleaning the superimposed surface of the screen mask 21 after a printing process, as necessary, and/or a "post-printing inspection" for inspecting the state of printing on the board W after printing.

Returning to FIG. 5, the control unit 60 increments the count variable N (step S103) when one term of the sub-routine of the printing process has been completed, judges whether or not the incremented count variable N has reached the production quantity Tn(R) that has been read out (step S104), and if N has not reached Tn(R), returns to the sub-routine of the printing process in step S102 and repeats the printing process described above.

If the incremented count variable N has reached the read out production quantity Tn(R), then the operation of the working system is terminated.

Meanwhile, in the printing unit on the standby side, the count variable R for counting the manufacturing sequence is first incremented when the parallel processing is started (step S111). Thereupon, it is judged whether or not there remains any unprocessed data corresponding to the incremented count variable R (step S112), and if there is unprocessed data, then production data, such as the part number I(R) of the board W, and the production quantity Tn(R) which is associated with this part number I(R), and so on, are acquired from the printing program storage unit 62 (step S113). Next, set-up instruction information required by the user to execute the setting up of the printing process relating to the part number I(R) which is read out in this step is then displayed on the display unit 70 corresponding to the printing unit (step S114).

The user carries out a prescribed set-up process while looking at the display (step S115). In this set-up process, the user switches the mask fixing member 22, installs a new screen mask 21 for the board W relating to the part number I(R) which is to be manufactured in the next process, supplies cream solder to the screen mask 21, and performs a rolling task for spreading the cream solder on a printing pattern formed on the screen mask 21. Thereupon, the user carries out an alignment task to align the phase of the board W with the phase of the screen mask 21, on the basis of control data stored in the data memory section 63. Here, if the alignment is not satisfactory, then adjustment is performed using an adjustment mechanism. Moreover, the user makes a test print, and adjusts the parameters stored in the data memory section 63. Upon completing the adjustment task, the user operates the display buttons described above, and reports the completion of the task to the control unit 60.

Figure 5:
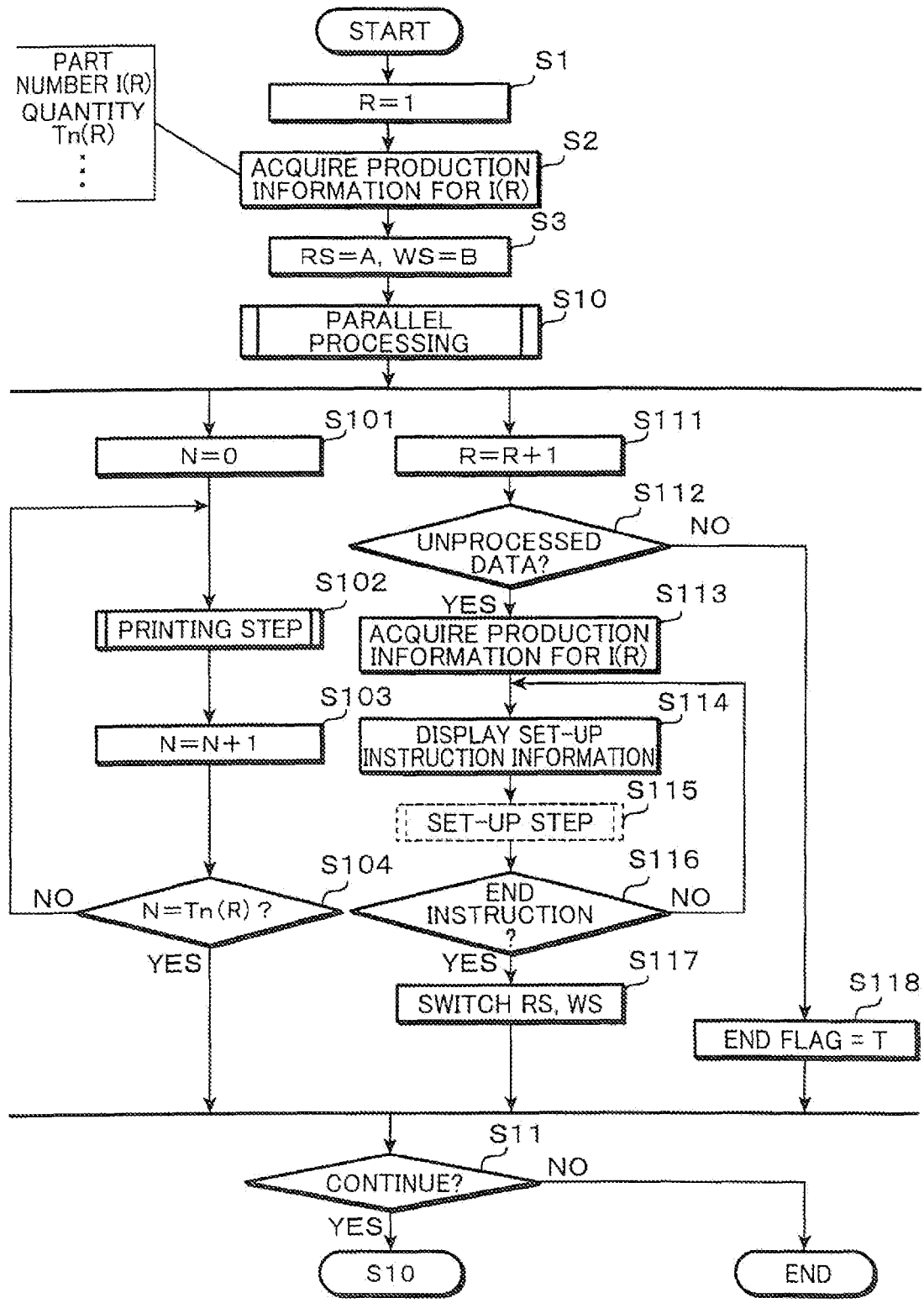
FIG. 5 is a flowchart showing an example of control by the screen printing apparatus in FIG. 1.

When step S114 in FIG. 5 has been executed, the control unit 60 waits until the user has completed the set-up process (step S115) (step S116). When the operations performed by the user are detected, the control unit 60 respectively changes the identifier values RS and WS (step S117) and then terminates the processing of the standby system. If there is no unprocessed data in the judgment in step S112, then the value of the end flag is set to True (step S118), and the processing of the standby system is terminated at this point.

When processing has been completed in both the working system and the standby system, the control unit 60 judges whether or not to continue work, by referring to the value of the end flag (step S11). If the value of the end flag is FALSE, then the parallel sub-routine S10 in the step S10 is executed again. As a result of this, the control unit 60 drives the motors 5A, 5B on the basis of the setting in step S117, interchanges the working system printing unit and the standby system printing unit, and then repeats the tasks described above. By this means, even in a production line in which the part number I(R) is switched frequently, it is possible to maintain high through-put, as shown in FIG. 7.

Figure 7:
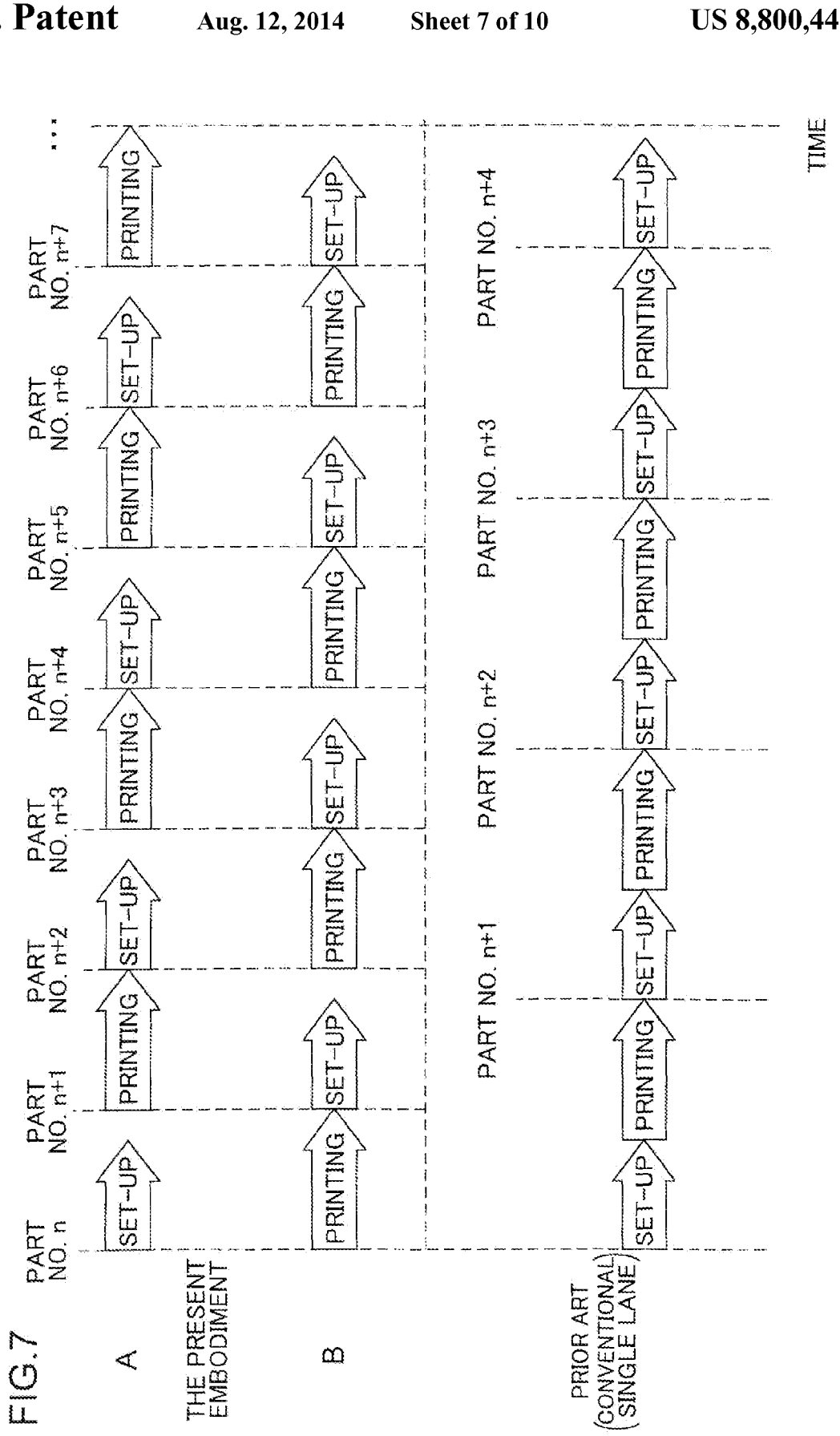
FIG. 7 is a timing chart showing an example of implementation of the flowchart in FIG. 5.

Referring to FIG. 7, when the flowchart described above is executed, the side A printing unit and the side B printing unit alternately repeat set-up and printing operations, and therefore it is possible to carry out one printing task in parallel, during another printing process. As a result of this, even if the part number is switched frequently, the printing process can be continued in virtually seamless fashion, and a high working ratio can be maintained.

On the other hand, in a conventional single lane configuration, it has been necessary to carry out a set-up task and a printing process sequentially, and therefore the through-put has declined markedly in the case of small-volume diverse-component production, which has been demanded in recent years.

As described above, the present embodiment is a single-lane screen printing apparatus 1 adapted to receive, from a prescribed board entry position En, a board W conveyed along a prescribed conveyance direction, to carry out screen printing, and to transport the board W after printing from a single board exit position Ex set on a downstream side in terms of the conveyance direction, the screen printing apparatus comprising: a first printing unit (the board supporting table 10A and the printing execution unit 20A) and a second printing unit (the board supporting table 10B and the printing execution unit 20B) respectively adapted to execute a printing process for the screen printing including steps of receiving the board W sent out from the board entry position En, carrying out screen printing, and conveying the board W after screen printing so as to transport the board W from the board exit position Ex; and a control unit 60 for controlling operation of the first and second printing units in such a manner that one printing unit (for example, the board supporting table 10A and the printing execution unit 20A), of the first and second printing units, functions as a working system that carries out the printing process, while the other printing unit (for example, the board supporting table 10B and the printing execution unit 20B) is made available for a set-up task for a next process, as a standby system. Therefore, in the present embodiment, a pair of printing units are composed in a single-lane production line, and set-up tasks for a next process can be performed in parallel in one printing unit while the other printing unit is operated to carry out a printing process, whereby the through-put of both printing units is raised and printing efficiency is improved.

Furthermore, in the present embodiment, the first and second printing units are arranged in parallel in a Y axis direction perpendicular to the conveyance direction; a working position for carrying out the printing process is arranged between the first and second printing units in the Y axis direction; a printing unit drive mechanism (rails 3, ball screws 4A, 4B, motors 5A, 5B, etc.) is provided to drive the first and second printing units so as to be independently movable along the Y axis direction; and the control unit 60 controls the printing unit drive mechanism such that the printing unit for the working system is arranged in the working position and the printing unit constituting the standby system is arranged in a standby position where interference with the printing unit constituting the working system can be avoided. Therefore, in the present embodiment, it is possible to carry out alternate printing tasks smoothly, by the respective printing units.

The embodiments described above are merely desirable concrete examples of the present invention and the present invention is not limited to the embodiments described above.

Figure 8:
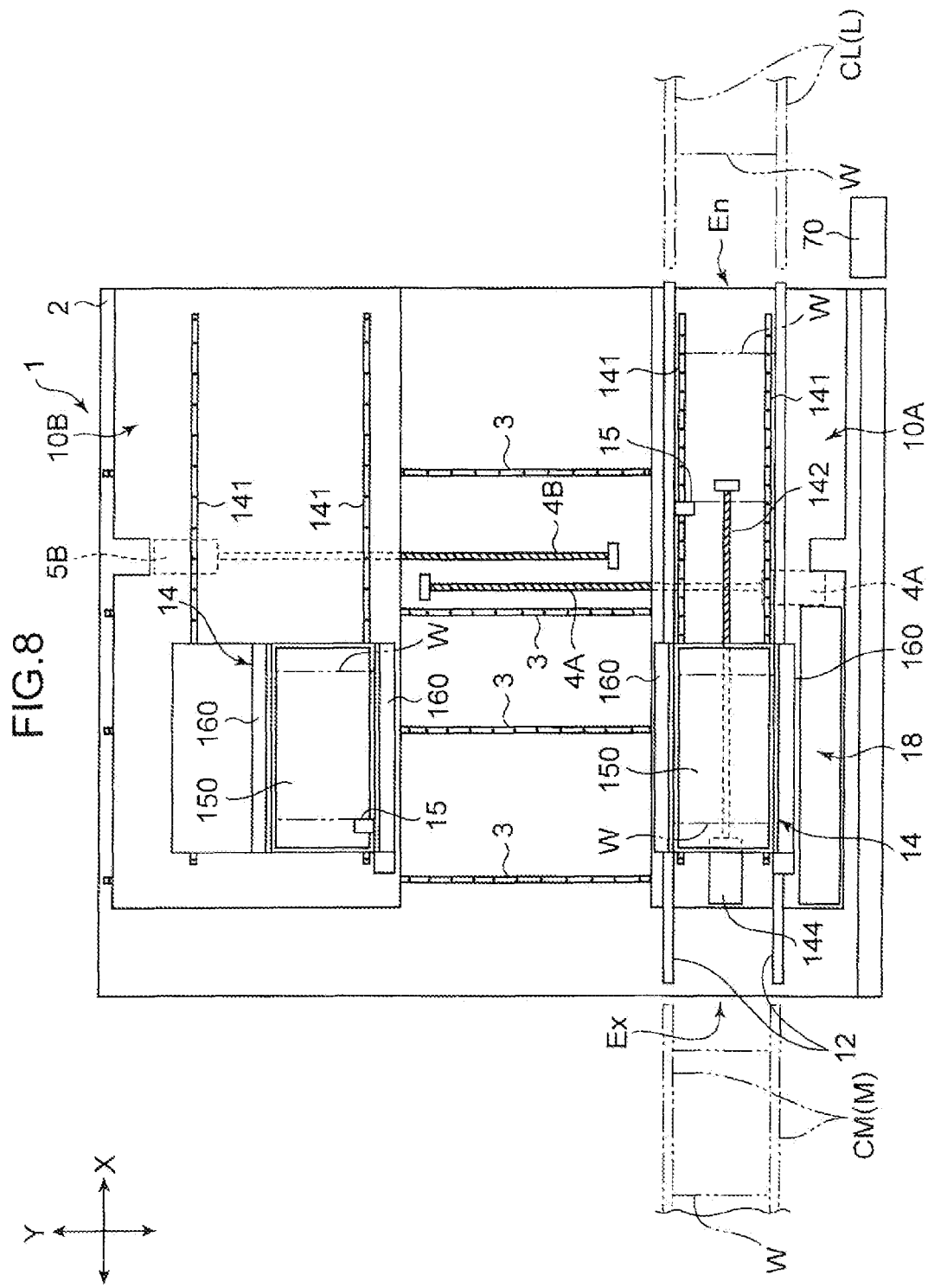
FIG. 8 is a schematic plan view showing the principal parts of a screen printing apparatus relating to a further embodiment of the present invention.

For example, it is possible to adopt the mode shown in FIG. 8.

Referring to FIG. 8, in the screen printing apparatus 1 shown in this drawing, the board entry position En and the board exit position Ex are situated on one end side (side A) in the Y axis direction of the base 2, and therefore the drive elements in the Y axis direction (rails 3, ball screw 4A, motor 5A, and the like) are left in unaltered fashion in preparation for future specification changes, but a printing process is substantially carried out on side A only.

Therefore, in the case of FIG. 8, the board supporting tables 10A, 10B, and the printing execution units 20A, 20B respectively have common specifications so as to be detachable and interchangeable. Furthermore, the first and second printing units are controlled by a display unit 70 which is situated on side A.

In the operation shown in FIG. 8, while a printing process is being carried out by the side A printing unit on the basis of the display on the display unit 70, set-up tasks are carried out in the printing unit which is at standby on side B, similarly to the first embodiment. When both the set-up task and the printing task have been completed, the printing execution unit 20A (20B) which is currently forming the side A printing unit is removed from the substrate supporting table 10A (10B) and is changed manually to the printing unit which has been set up as the side B printing unit. In this way, on side A, it is possible to operate the printing unit again with the previously set up printing execution unit 20B (20A), by means of a very quick set-up replacing operation. Furthermore, by installing the removed printing execution unit 20A (20B) in the side B printing unit, this printing execution unit 20A (20B) can be used in a set-up task for the next printing process. In this way, it is possible to improve productivity by exchanging the print execution units 20A (20B) each time the part number is changed.

Figure 9:
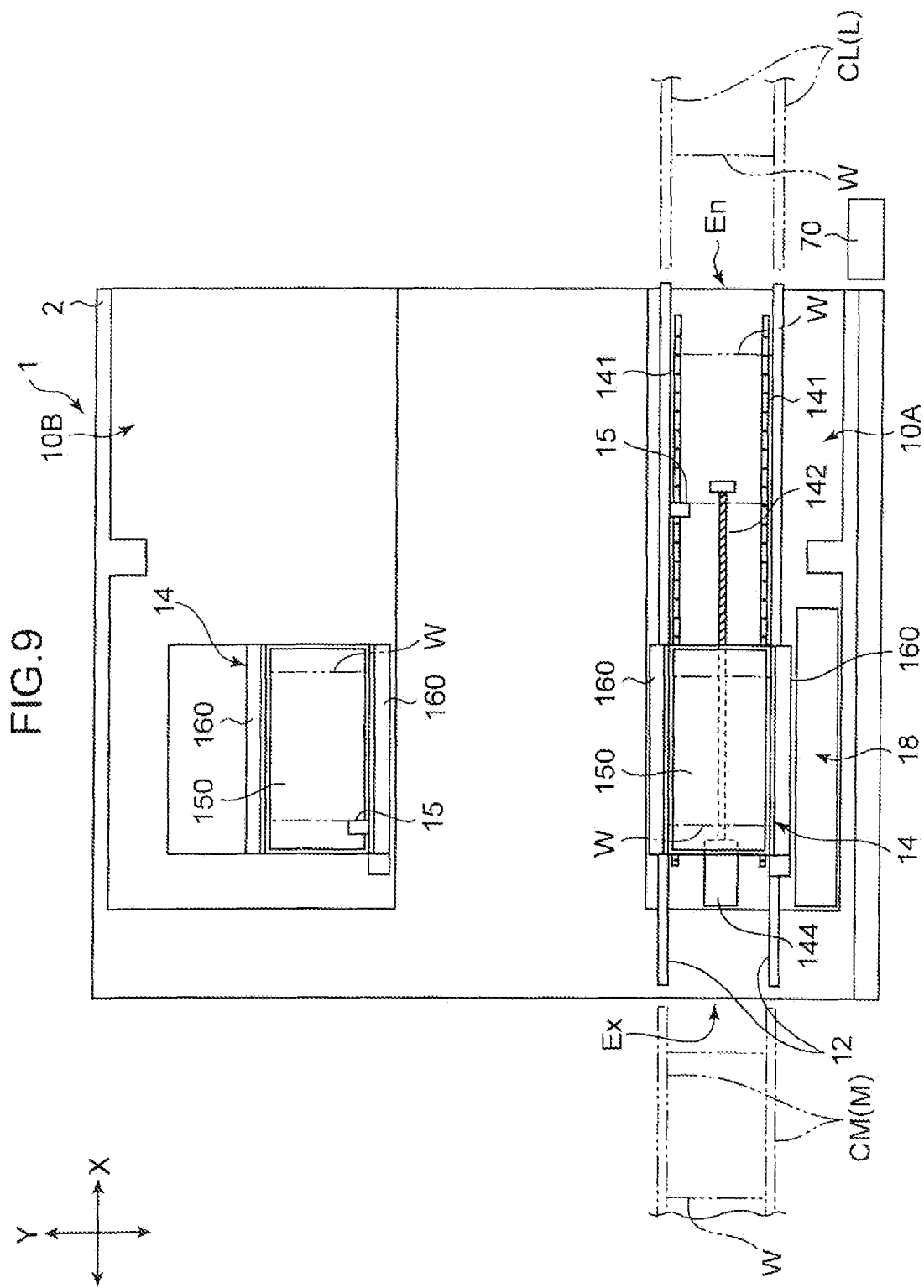
FIG. 9 is a schematic plan view showing the principal parts of a screen printing apparatus relating to yet a further embodiment of the present invention.

Moreover, even if employing a screen printing apparatus 1 which omits the drive elements in the Y axis direction (the rails 3, ball screw 4A, motor 5A, and the like) as shown in FIG. 9, it is possible to apply the screen printing apparatus in a similar fashion to the case shown in FIG. 8.

In this way, the embodiment shown in FIG. 8 and FIG. 9 is a screen printing apparatus adapted to receive, from a prescribed board entry position En, a board W conveyed along a prescribed conveyance direction, to carry out screen printing, and to transport the board W after printing from a single board exit position Ex set on a downstream side in terms of the conveyance direction, wherein the screen printing apparatus comprises a pair of printing units respectively adapted to execute a printing process for the screen printing including steps of receiving the board W sent out from the board entry position En to be provided for the screen printing, carrying out screen printing, and conveying the board W after screen printing so as to transport the board W from the board exit position Ex; and the printing units are mutually arranged interchangeable between a working position for carrying out the printing process (side A in FIG. 9 and FIG. 9) and a standby position, situated adjacently to the working position, for making the printing unit available for set-up for a next process (side B in FIG. 8 and FIG. 9). Therefore, in the present embodiment, a pair of printing units are composed in a single-lane production line, one of the printing units (for example, the board supporting table 10A and the printing execution unit 20A) can be moved to a working position to carry out a printing process, while the other printing unit (for example, the board supporting table 10B and the printing execution unit 20B) is available for set up for a next process, at a standby position, while the one printing unit (for example, the board supporting table 10A and the printing execution unit 20A) is working, in addition to which, when a printing process in the one printing unit (for example, the board supporting table 10A and the printing execution unit 20A) has ended, and the set-up tasks in the other printing unit (for example, the board supporting table 10B and the printing execution unit 20B) have ended, the printing execution unit 20A (20B) can be switched immediately between a working position and a standby position, thus raising the through-put of both printing units and improving the printing efficiency.

In the embodiment described above, both the entry side and the exit side are formed as a single lane. However, the present invention can also be applied to a case where the entry side is formed as a dual lane.

Figure 10:
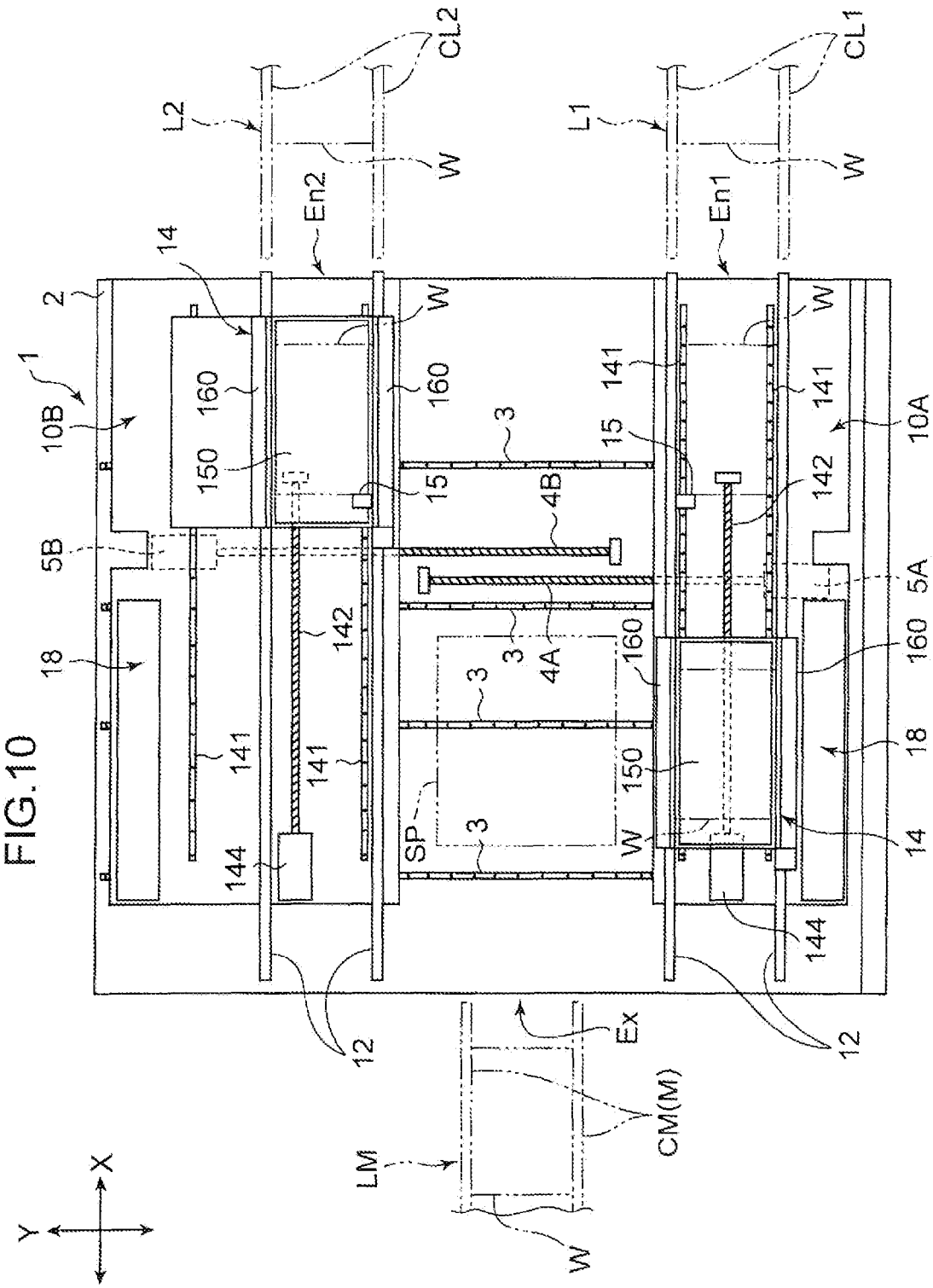
FIG. 10 is a schematic plan view of a screen printing apparatus relating to yet a further embodiment of the present invention.

Referring to FIG. 10, in the embodiment shown in this drawing, a pair of loaders L1, L2 are arranged on the entry side. The loaders L1, L2 are provided with a belt conveyor pair CL1, CL2 similarly to the embodiment shown in FIG. 1. One loader L1 aligns with the board supporting table 10A which forms the side A printing unit at a first board entry position En1 provided on a side A in the Y axis direction. The other loader L2 aligns with the board supporting table 10B which forms the side B printing unit at a second board entry position En2 provided on a side B in the Y axis direction. The loader L1 (L2) opposing the board supporting table 10A (10B) functions as a working system loader for the board supporting table 10A (10B) which constitutes the printing unit of the working system. The loader L1 (L2) conveys the board W to the printing unit of the working system. The loader L2 (L1) opposing the board supporting table 10B (10A) functions as a standby system loader for the board supporting table 10B (10A) which constitutes the printing system of the standby system. Consequently, even in a mode where the entry side is formed as a dual lane, it is possible to carry out set-up tasks for a printing process of the next process, in the standby system. Therefore, even in the mode shown in FIG. 10, the printing units of the working system and the standby system are constituted alternately on the basis of the flowchart shown in FIG. 5, and it is possible to transport the board W to the part mounting apparatus M which is composed as a single lane.

In this way, in a case where the board entry positions En1, En2 are provided as a pair for each printing unit, and the loaders L1, L2 forming the board conveyance mechanisms can be set so as to correspond to each of the pair of printing units, then on the entry side, it is possible to constitute working and standby systems so that set-up tasks including conveyance width adjustment in the loaders L1, L2, and the like, are carried out in parallel in one system while work is carried out in the other system, thus contributing to improvement in through-put, in the loaders L1, L2 as well.

As described above, the present invention is a screen printing apparatus which receives, from a prescribed board entry position, a board conveyed along a prescribed conveyance direction, carries out screen printing, and transports the board after printing from a single board exit position set on a downstream side in terms of the conveyance direction, the screen printing apparatus comprising: a first printing unit and a second printing unit respectively adapted to execute a printing process for the screen printing including steps of receiving the board from the board entry position to be provided for the screen printing, carrying out the screen printing, and conveying the board after screen printing so as to transport the board from the board exit position; and a control unit for controlling operation of the first and second printing units in such a manner that one of the first and second printing units functions as a working system that carries out the printing process, while the other printing unit is provided as a standby system that is available for a set-up task for a next process. In this mode, a pair of printing units are composed in a single-lane production line, and set-up tasks for a next process can be performed in parallel in one printing unit while the other printing unit is operated to carry out a printing process, whereby the through-put of both printing units is raised and printing efficiency is improved.

In a desirable mode, the board entry position is adapted to set a pair of a board conveyance mechanism constituting the working system and a board conveyance mechanism constituting the standby system can be set so as to correspond to each of the pair of printing units. In this mode, on the entry side also, a working system and a standby system are constituted and set-up tasks can be carried out in parallel in one system, while the other system is performing work, whereby it is possible to contribute to improvement of through-put in the board conveyance mechanism disposed on the upstream side, also.

In a desirable mode, the first and second printing units are arranged in parallel in a specific direction perpendicular to the conveyance direction; a working position for carrying out the printing process is arranged between the first and second printing units in the specific direction; a printing unit drive mechanism is provided to drive the first and second printing units so as to be independently movable along the specific direction; and the control unit controls the printing unit drive mechanism such that the printing unit for the working system is arranged in the working position and the printing unit constituting the standby system is arranged in a standby position where interference with the printing unit constituting the working system can be avoided. In this mode, it is possible to carry out alternate printing tasks smoothly, by the respective printing units.

A further mode of the present invention is a screen printing apparatus which receives, from a prescribed board entry position, a board conveyed along a prescribed conveyance direction, carries out screen printing, and transports the board after printing from a single board exit position set on a downstream side in terms of the conveyance direction, the screen printing apparatus comprising a pair of printing units each adapted to execute a printing process including steps of receiving the board from the board entry position to be provided for the screen printing, carrying out the screen printing, and conveying the board after screen printing so as to transport the board from the board exit position, wherein the printing units are mutually arranged interchangeable between a working position for carrying out the printing process, and a standby position situated adjacently to the working position where the printing unit is provided for a set-up task for a next process. In this mode, the pair of printing units are composed in a single-lane production line, and either one of the print units can be moved to the working position to carry out a printing process, in addition to which set-up for a next process can be carried out in the other printing unit at a standby position, while the one printing unit is working. Furthermore, if the printing process by the one printing unit has been completed and the set-up tasks in the other printing unit have been completed, then it is possible to immediately switch the printing unit between the working position and the standby position, and therefore the through-put of both printing units is raised and the printing efficiency is improved.

In a desirable mode, the pair of printing units each include: a board supporting table for supporting the board; and a printing execution unit. The printing execution unit includes a screen mask detachably integrated with the board supporting table and adapted to be placed atop the board, and a squeegee unit that performs screen printing by means of the screen mask, the printing execution units having common specifications so as to be interchangeable between the pair of printing units. In this mode, only the printing execution units which are required for printing are interchanged, and therefore the work is simplified and moreover, the overall equipment costs can be reduced.

In a desirable mode, the printing unit includes a board supporting table; and the board supporting table includes a rail extending in the conveyance direction, and a clamp unit adapted to be movable in the conveyance direction by the rail, so that the clamp unit receives the board before printing from the board entry position, on the upstream side of the rails in the board conveyance direction, and transports the board after screen printing to the board exit position, on the downstream side of the rails in the board conveyance direction. In this mode, the length in the board conveyance direction is increased, and the working position, printing position and standby position can be set respectively to appropriate positions in the production line.

As described above, according to the present invention, a pair of printing units are composed in a single-lane production line and while one of the printing units is operated so as to carry out a printing process, the other printing unit can be made available for set-up tasks, whereby a printing process and set-up tasks can be performed in parallel even in cases where small-volume diverse-component production is carried out in a single lane, for example. Therefore, marked beneficial effects are obtained in that the through-put of both printing units is raised and through-put is improved dramatically.

This application is based on Japanese patent application serial no. 2011-122924, filed in Japan Patent Office on May 31, 2011, the contents of which are hereby incorporated by reference.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be construed as being included therein.

What is claimed is:

1. A screen printing apparatus configured to receive, from a prescribed board entry position, a board conveyed along a prescribed conveyance direction, to carry out screen printing, and to transport the board after printing from a single board exit position set on a downstream side in terms of the conveyance direction, the screen printing apparatus comprising:

a first printing unit and a second printing unit respectively configured to execute a printing process for the screen printing including steps of receiving the board from the board entry position to be provided for the screen printing, carrying out the screen printing, and conveying the board after screen printing so as to transport the board from the board exit position;

a control unit for controlling operation of the first printing unit and the second printing unit so that one of the first printing unit and the second printing unit functions as a printing unit for a working system that carries out the printing process, while the other printing unit functioning as a printing unit for a standby system that is available for a set-up task for a next process;

a print program memory section configured to store transaction data;

operating buttons configured to convey information from a user to the control unit; and a display unit configured to display a state of processing, wherein the board entry position being configured to set a pair of board conveyance unit each constituting the working and standby systems corresponding to the respective printing units, the control unit being configured to:
acquire existing unprocessed data from the print program memory section while the working system is conducting the printing in order to prepare next printing process for the standby system;
display set-up instruction information on the display unit in order for a user to execute set-up of the printing process relating to the unprocessed data;
detect information through the display unit when the user operates the display unit to report the completion of a task; and
switch the printing unit for the working system to a printing unit for the standby system and the printing unit for the standby system to a printing unit for the working system when processing is completed in both the working system and the standby system.

2. The screen printing apparatus according to claim 1, wherein:
the first printing unit and the second printing unit are arranged in parallel in a specific direction perpendicular to the conveyance direction;
a working position for carrying out the printing process is arranged between the first printing unit and the second printing unit in the specific direction;
a printing unit drive mechanism is provided to drive the first and second printing units independently movable along the specific direction; and
the control unit controls the printing unit drive mechanism such that the printing unit for the working system is arranged in the working position and the printing unit for the standby system is arranged in a standby position where interference with the printing unit constituting the working system is avoided.

3. The screen printing apparatus according to claim 1, wherein the first and the second printing units are mutually interchangeable between a working position for carrying out the printing process and a standby position situated adjacently to the working position where the printing unit is provided for a set-up task for a next process.

4. The screen printing apparatus according to claim 3, wherein each of the first and second printing units includes:
a board supporting table for supporting the board; and
a printing execution unit,
wherein the printing execution unit includes a screen mask detachably integrated with the board supporting table and configured to be placed atop the board, and a squeegee unit that performs screen printing by unit of the screen mask,
the printing execution unit for the first printing unit and the printing execution unit for the second printing unit have common specifications.

5. The screen printing apparatus according to claim 1, wherein the printing unit includes a board supporting table, the board supporting table having:
a rail extending in the conveyance direction, and
a clamp unit configured to be movable in the conveyance direction by the rail, the clamp unit receiving a board before printing from the board entry position on the upstream side of the rail in the board conveyance direction, and the clamp unit transporting the board after screen printing to the board exit position on the downstream side of the rails in the board conveyance direction.

* * * * *